United States Patent
Tsujimura et al.

(12) 
(10) Patent No.: US 7,038,278 B2
(45) Date of Patent: May 2, 2006

(54) THIN FILM TRANSISTOR, IMAGE DISPLAY DEVICE, AND IMAGE DISPLAY APPARATUS

(75) Inventors: Takatoshi Tsujimura, Shiga (JP); Mitsuo Morooka, Shiga (JP)

(73) Assignees: Chi-Mei Optoelectronics Corp., Taiwan (CN); Kyocera Corporation, Kyoto (JP)

( * ) Notice: Subject to any disclaimer, the term of this patent is extended or adjusted under 35 U.S.C. 154(b) by 188 days.

(21) Appl. No.: 10/638,499

(22) Filed: Aug. 12, 2003

(65) Prior Publication Data

US 2004/0036072 A1 Feb. 26, 2004

(30) Foreign Application Priority Data

Aug. 26, 2002 (JP) ...................... 2002-245322

(51) Int. Cl.
- H01L 27/01 (2006.01)
- H01L 27/12 (2006.01)
- H01L 31/0392 (2006.01)

(52) U.S. Cl. ........................... 257/350; 257/59; 257/72; 257/84; 257/296; 257/401

(58) Field of Classification Search ................ 257/59, 257/72, 350, 401, 84, 296
See application file for complete search history.

(56) References Cited

U.S. PATENT DOCUMENTS

| 6,191,453 B1 * | 2/2001 | Petruzzello et al. ......... 257/350 |
| 6,525,383 B1 * | 2/2003 | Stecher ....................... 257/401 |
| 6,650,001 B1 * | 11/2003 | Yamaguchi et al. ........ 257/557 |

FOREIGN PATENT DOCUMENTS

| JP | 8-148690 A | 6/1996 |
| JP | 2762968 B2 | 3/1998 |

\* cited by examiner

*Primary Examiner*—Ngân V. Ngô
(74) *Attorney, Agent, or Firm*—Birch, Stewart, Kolasch & Birch, LLP

(57) ABSTRACT

A thin film transistor is circular when viewed from top. A first source/drain region is disposed at the center, a semiconductor layer surrounds the first source/drain region and overlaps with an external periphery of the first source/drain region, and a second source/drain region surrounds the semiconductor layer and overlaps the external periphery of the semiconductor layer. The potential of the second source/drain region is set higher than the potential of the first source/drain region. The external periphery of the first source/drain region and the internal periphery of the second source/drain region have concentric circular shapes.

12 Claims, 8 Drawing Sheets

15 SOURCE/DRAIN REGION
16 SEMICONDUCTOR LAYER
17 SOURCE/DRAIN REGION

26 POWER SOURCE LINE
CAPACITOR 27
THIN FILM TRANSISTOR 22
THIN FILM TRANSISTOR 23
25 DATA LINE
ORGANIC LED 21
24 SCAN LINE

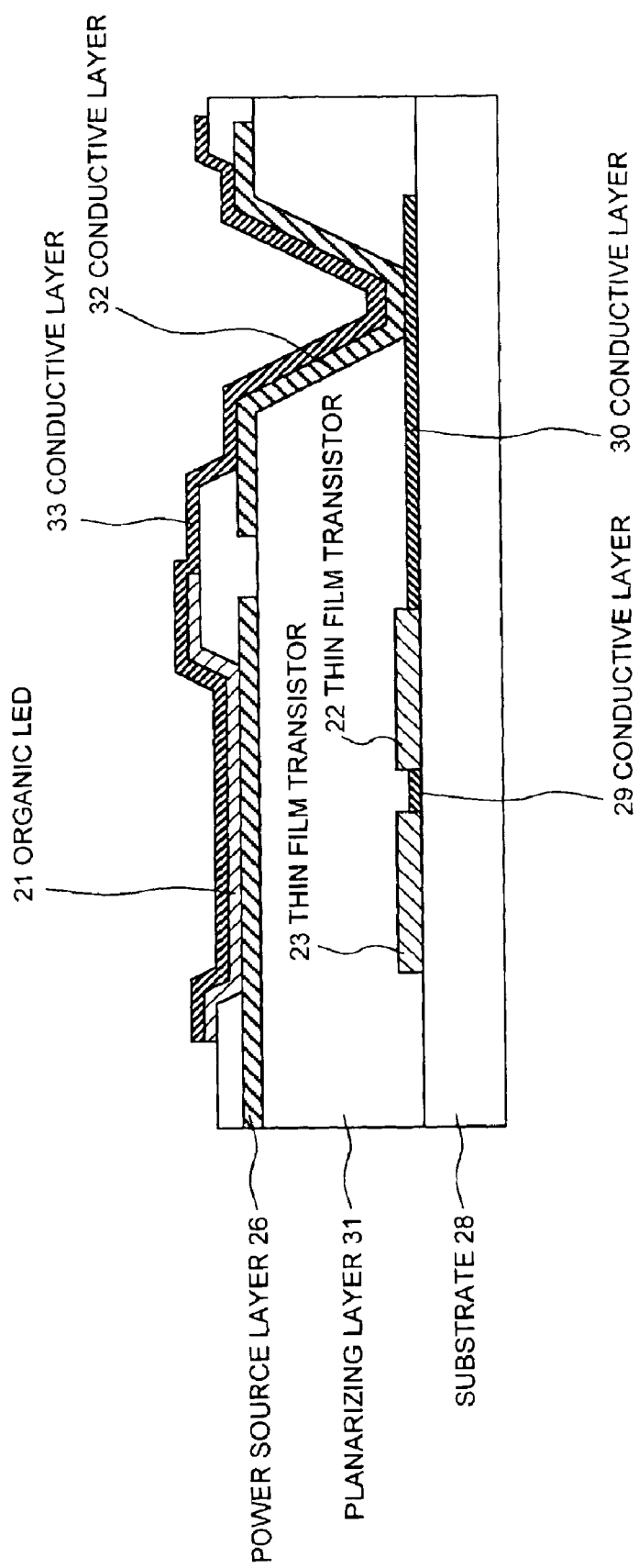

THIN FILM TRANSISTOR, IMAGE DISPLAY DEVICE, AND IMAGE DISPLAY APPARATUS

BACKGROUND OF THE INVENTION

1) Field of the Invention

The present invention relates to a thin film transistor that suppresses aging of a threshold voltage.

2) Description of the Related Art

Image display apparatus with the organic light emitting diodes (LEDs) are attracting great attention. The reason being that the organic LEDs have self-luminescence, and therefore, the organic LEDs do not require a back light. The organic LEDs have better response, contrast, and visibility as compared to the liquid crystal devices. Since the structure of the organic LEDs is simple, the organic LEDs can be manufactured at low cost.

FIGS. 9A and 9B illustrate a conventional image display apparatus. As shown in FIG. 9A, a gate electrode of a thin film transistor 102, which functions as a driver, is connected to an anode electrode of an organic LED 101. A potential applied to the gate electrode of the thin film transistor 102 is adjusted to control an electric current that flows through the organic LED 101. The luminance of the light emitted from the organic LED 101 varies in accordance with the current flowing through it. Thus, the luminance of the organic LED 101 can be readily controlled by controlling the gate potential of the thin film transistor 102.

A not shown second thin film transistor controls the gate potential of the thin film transistor 102. The second thin film transistor functions as a switching device. The second thin film transistor receives a display signal and a scan signal from a predetermined data line and a predetermined scan line respectively, and controls the gate electrode of the thin film transistor 102. The self-luminescent image display apparatus is realized by providing an array of the structure shown in FIG. 9A and the second thin film transistor, corresponding to the number of pixels.

FIG. 9B illustrates a top view of the thin film transistor 102. The thin film transistor 102 has a channel 104 sandwiched between source/drain electrodes 103 and 105. An electric current is induced in the channel 104 when a predetermined potential is applied to the channel 104 from the gate electrode of the thin film transistor 102. The channel 104 has a semiconductor layer that has the same conductivity as that of a source/drain region that is disposed below the source/drain electrodes 103 and 105. As a result, an electric current can flow from the source/drain electrode 103 to the source/drain electrode 105 and vice versa.

However, the conventional image display device has many problems. Aged degradation of the thin film transistor that controls the luminance of the organic LED is one of the problems.

When displaying an image, the organic LED corresponding to each pixel is turned on. In other words, the thin film transistor 102 is always kept on, and an electric current of a necessary level is made to flow through the channel 104 to make the organic LED emit a light of desired luminance.

It is known that the density of the current in the channel 104 is not uniform. For example, the current gets concentrated near the ends of the channel 104 due to the electric field integration at the ends. When the switching device of the liquid-crystal display apparatus functions as a voltage driving device, the anisotropy of the current density is not a problem. However, in the image display apparatus, a current flows through the channel 104 over a long time. Therefore, the thin film transistor 102 is physically damaged due to the current concentration, which causes a variation in the threshold voltage.

When the threshold voltage changes, the current that flows through the channel 104 deviates from a desired level, even when the same potential is applied to the gate electrode of the thin film transistor 102 that controls the light emission state of the organic LED 101. Corresponding to the variation in the current that flows through the channel 104, the current that flows through the organic LED 101 also changes. Therefore, the change in the threshold voltage of the thin film transistor 102 directly affects the luminance of the organic LED 101. As a result, the image definition is degraded. Specifically, when the threshold voltage of the thin film transistor 102 deviates, a sticking of the screen occurs and the luminance changes, which shortens the life of the image display apparatus.

SUMMARY OF THE INVENTION

It is an object of the present invention to solve at least the problems in the conventional technology.

A thin film transistor according to one aspect of the present invention includes a first source/drain electrode; a first source/drain region that is connected the first source/drain electrode, wherein the first source/drain region has a predetermined first potential, wherein the first source/drain region has an external periphery; a second source/drain electrode; a second source/drain region that is connected to the second source/drain electrode, wherein the second source/drain region has an internal periphery that overlaps the external periphery of the first source/drain region, wherein at least during the operation the second source/drain region has a predetermined second potential that is higher than the first potential; a semiconductor layer that is disposed between the first source/drain region and the second source/drain region; and a gate electrode that induces a channel in the semiconductor layer.

An image display device according to another aspect of the present invention includes a light-emitting device; a first thin film transistor that controls a light emission state of the light-emitting device; a second thin film transistor that controls the gate electrode of the first thin film transistor; and a capacitor that holds a gate potential of the first thin film transistor, wherein the gate potential of the first thin film transistor is controlled by the first thin film transistor. The first thin film transistor includes a first source/drain electrode; a first source/drain region that is connected the first source/drain electrode, wherein the first source/drain region has a predetermined first potential, wherein the first source/drain region has an external periphery; a second source/drain electrode; a second source/drain region that is connected to the second source/drain electrode, wherein the second source/drain region has an internal periphery that overlaps the external periphery of the first source/drain region, wherein at least during the operation the second source/drain region has a predetermined second potential that is higher than the first potential; a semiconductor layer that is disposed between the first source/drain region and the second source/drain region; and a gate electrode that induces a channel in the semiconductor layer.

An image display apparatus according to still another aspect of the present invention includes a plurality of scan lines and a plurality of data lines that are disposed in a matrix form and are connected to driving circuits respectively; light-emitting devices that are disposed corresponding to display pixels; power source lines that supply a current to the light-emitting devices; a first thin film transistor that is disposed between each light-emitting device and each power source line and that controls a light emission state of the light-emitting device; and a second thin film transistor that is disposed between the gate electrode of the first thin film transistor and a predetermined data line, and that controls a gate potential of the first thin film transistor. The first thin film transistor includes a first source/drain electrode; a first source/drain region that is connected the first source/drain electrode, wherein the first source/drain region has a predetermined first potential, wherein the first source/drain region has an external periphery; a second source/drain electrode; a second source/drain region that is connected to the second source/drain electrode, wherein the second source/drain region has an internal periphery that overlaps the external periphery of the first source/drain region, wherein at least during the operation the second source/drain region has a predetermined second potential that is higher than the first potential; a semiconductor layer that is disposed between the first source/drain region and the second source/drain region; and a gate electrode that induces a channel in the semiconductor layer.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 7 is a cross-sectional view of the image display apparatus according to the second embodiment;

DETAILED DESCRIPTION

Figure 1:
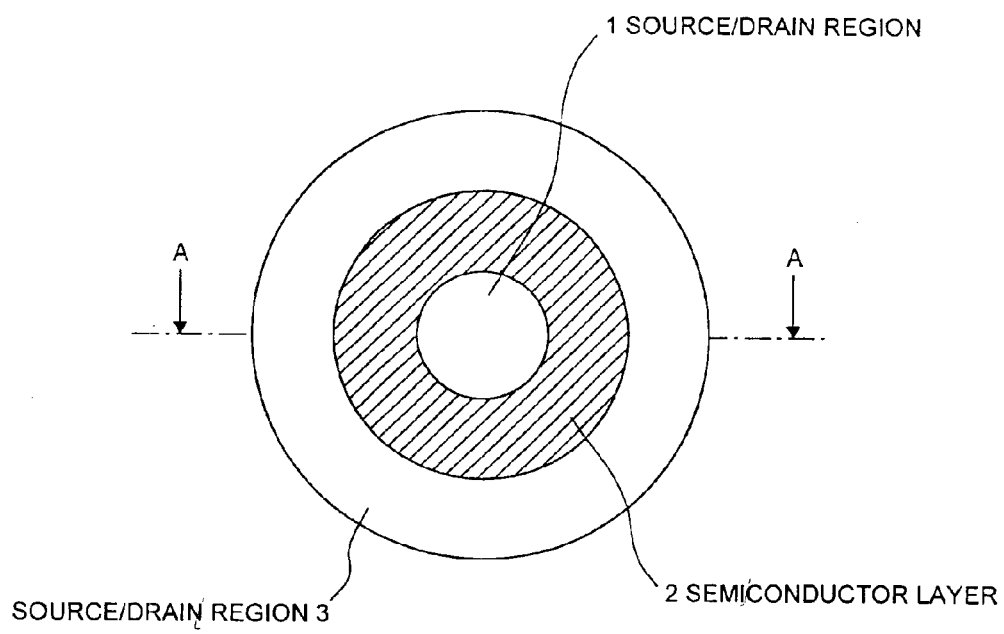
FIG. 1 is a top view of a thin film transistor according to a first embodiment of the present invention.

Exemplary embodiments of a thin film transistor, an image display device, and an image display apparatus according to the present invention will be explained below with reference to the drawings. In the drawings, identical or similar portions are attached with identical or similar reference symbols or names. It should be noted that the drawings are schematic views, and they do not exactly show detailed real parts. It is needless to mention that the drawings include portions of mutually different sizes or ratios. For the electrodes that constitute a thin film transistor, it is not necessary to distinguish between a source electrode and a drain electrode. Therefore, the two electrodes excluding the gate electrode will be referred to as source/drain electrodes. For a similar reason, a source region and a drain region will be referred to as source/drain regions.

In a thin film transistor according to a first embodiment of the present invention, one source/drain region is disposed to cover the external periphery of the other source/drain region. At least during the operation, the potential of the source/drain region disposed at the outside has a higher potential than the other source/drain region that is disposed at the inside.

FIG. 1 is a top view of the thin film transistor according to the first embodiment. In the top view, this thin film transistor is circular and has a source/drain region 1 near the center, a semiconductor layer 2 that surrounds the source/drain region 1 that is in contact with the outer periphery of the source/drain region 1, and a source/drain region 3 that surrounds the semiconductor layer 2 and that is in contact with an outer periphery of the semiconductor layer 2. The potential of the source/drain region 3 is set higher than the potential of the source/drain region 1.

Figure 2:
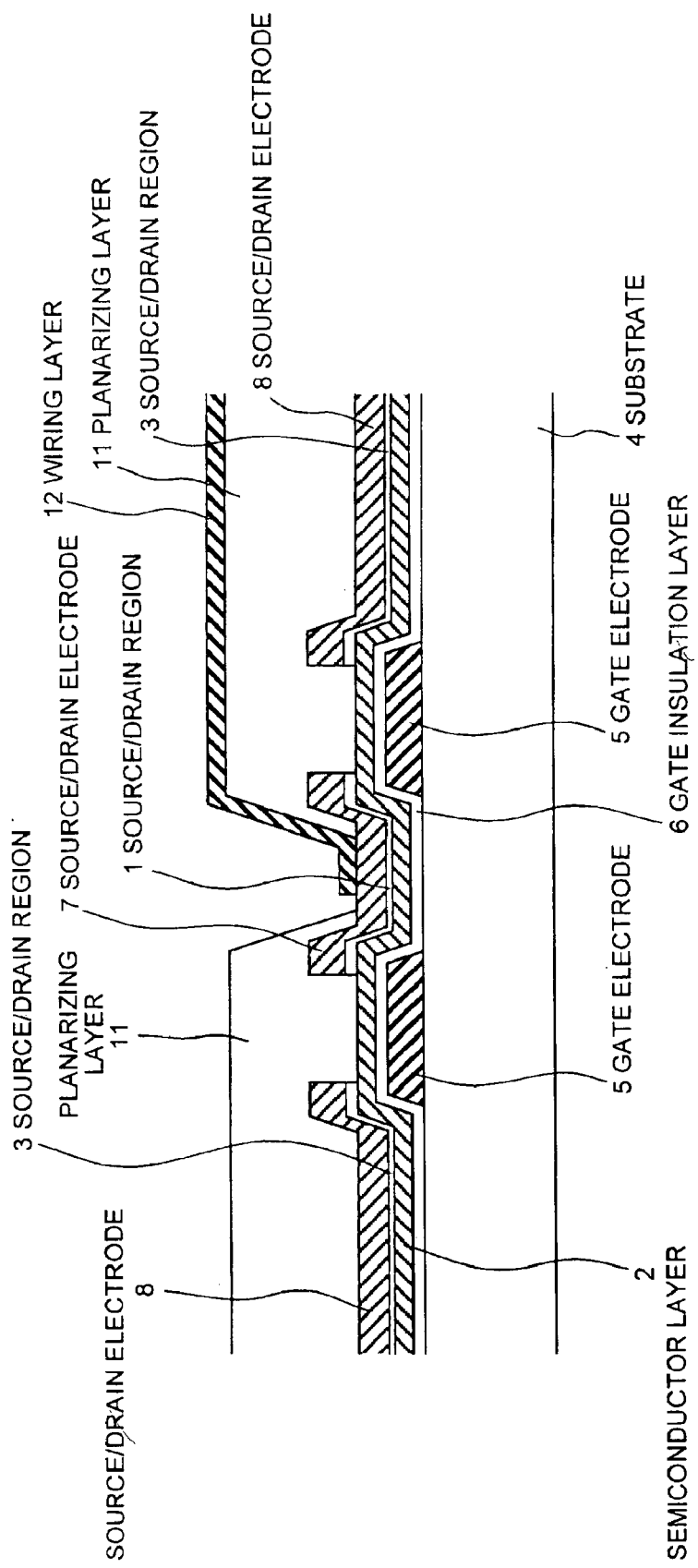
FIG. 2 is a cross-sectional view of the thin film transistor shown in FIG. 1 cut along a line A—A.

FIG. 2 is a cross-sectional view of the thin film transistor according to the first embodiment. The thin film transistor has a ring-shaped gate electrode 5 laminated on a substrate 4, a gate insulation layer 6 laminated on the substrate 4 and the gate electrode 5. The semiconductor layer 2 is laminated on the gate insulation layer 6, and the source/drain regions 1 and 3 are laminated on a part of the semiconductor layer 2. Source/drain electrodes 7 and 8 are laminated on the source/drain regions 1 and 3 respectively. A planarizing layer 11 is laminated on the source/drain electrodes 7 and 8 and the semiconductor layer 2. A part of the surface of the source/drain region 7 is connected to a wiring layer 12 for taking out an electrode.

The source/drain electrodes 7 and 8 and the gate electrode 5 are made of metal such as aluminum. The source/drain electrodes 7 and 8 and the gate electrode 5 may be made of material other than a metal, such as polysilicon doped with a high-concentration impurity, so long as the material has electrical conductivity.

The gate insulation layer 6 electrically insulates the gate electrode 5 from the semiconductor layer 2. The gate insulation layer 6 is thin and made of insulating material such as SiO2 and SiNx. While the gate insulation layer 6 is shown as a single-layer structure in FIG. 2, the gate insulation layer 6 may be formed in a multi-layer structure that has both SiNx and SiO2 laminated together.

The semiconductor layer 2 is formed as a semiconductor layer by having non-monocrystalline silicon such as polysilicon and amorphous silicon doped with an impurity of a certain concentration according to the needs. To form an n-channel thin film transistor, polysilicon is doped with an impurity of a III-group element such as boron (B), thereby to form a p-type semiconductor layer 2. When amorphous silicon is used, it is possible to omit the doping of an impurity, because a disconnected silicon bond functions as a donor. To form a p-channel thin film transistor, polysilicon is doped with a V-group element such as phosphor (P) and arsenic (As), thereby to form an n-type semiconductor layer 2.

In the following explanation, it is assumed that the thin film transistor according to the first embodiment is used as an n-channel thin film transistor that induces an n-channel. However, it is needless to mention that the thin film transistor according to the first embodiment can be used as a p-channel thin film transistor.

The source/drain regions 1 and 3 are formed as a semiconductor layer by having non-monocrystalline silicon such as polysilicon and amorphous silicon doped with an n-type impurity in high concentration. When the thin film transistor according to the first embodiment is a p-channel thin film transistor, the source/drain regions 1 and 3 are formed as a semiconductor layer doped with a p-type impurity in high concentration.

The planarizing layer 11 has a film structure that planarizes the upper surface of the thin film transistor. Based on the provision of the planarizing layer 11, there is an advantage that it is possible to easily dispose other circuit element such as an organic LED on the thin film transistor. In order also to achieve a function of insulating the wiring layer 12 disposed on the upper surface from the source/drain electrode 8, the planarizing layer 11 is formed with an insulating material such as polymer.

The wiring layer 12 is used to take the source/drain region 1 to the outside. Specifically, the wiring layer 12 has a structure electrically connected to the source/drain region 1, and is formed with a conductive material.

Figure 3:
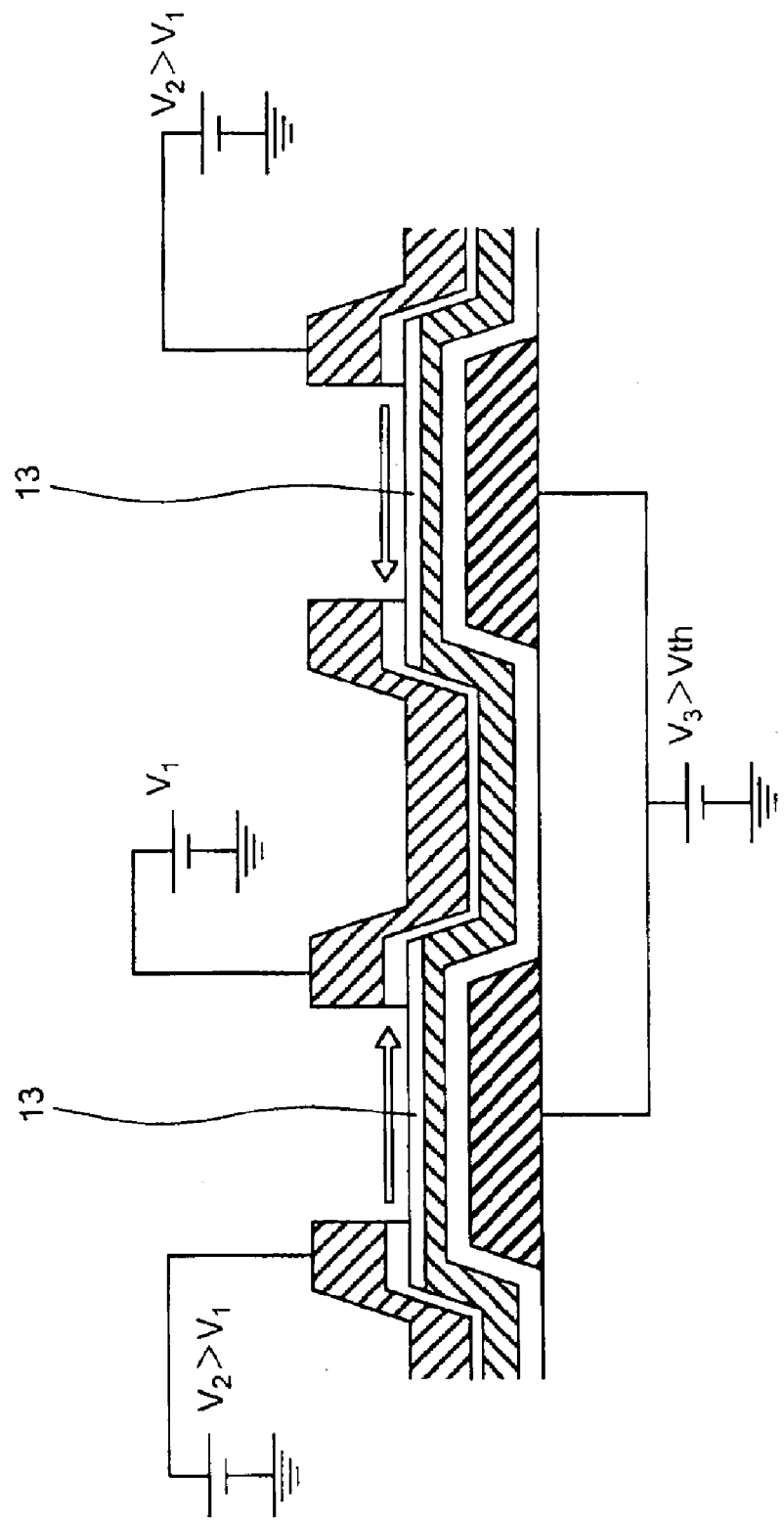
FIG. 3 describes the operation of the thin film transistor according to the first embodiment.

FIG. 3 describes the operation of the thin film transistor according to the first embodiment. When a potential V3 higher than a threshold potential Vth is applied to the gate electrode 5, an electric field is applied to the semiconductor layer 2, so that an n-channel 13 is induced within the semiconductor layer 2 as shown in FIG. 3. The n-channel 13 electrically connects the source/drain region 1 with the source/drain region 3. Therefore, a current flows from the source/drain region 3 that is applied with the potential V2 (where V2>V1), to the source/drain region 1 that is applied with the potential V1, via the n-channel 13 that is induced within the semiconductor layer 2. As the source/drain region 3 is disposed to cover the external periphery of the source/drain region 1, the induced n-channel 13 does not have an end portion as explained in the conventional technique, and does not have a concentration of the electric field. Therefore, the density of the current that flows through the n-channel 13 becomes uniform.

Next, unlike the conventional thin film transistor, the thin film transistor according to the first embodiment can suppress the variation in the threshold voltage even when a current is flown to the channel over a long time will be explained. The inventors of the present application actually prepared the thin film transistor according to the first embodiment, and measured the life the thin film transistor.

Figure 4:
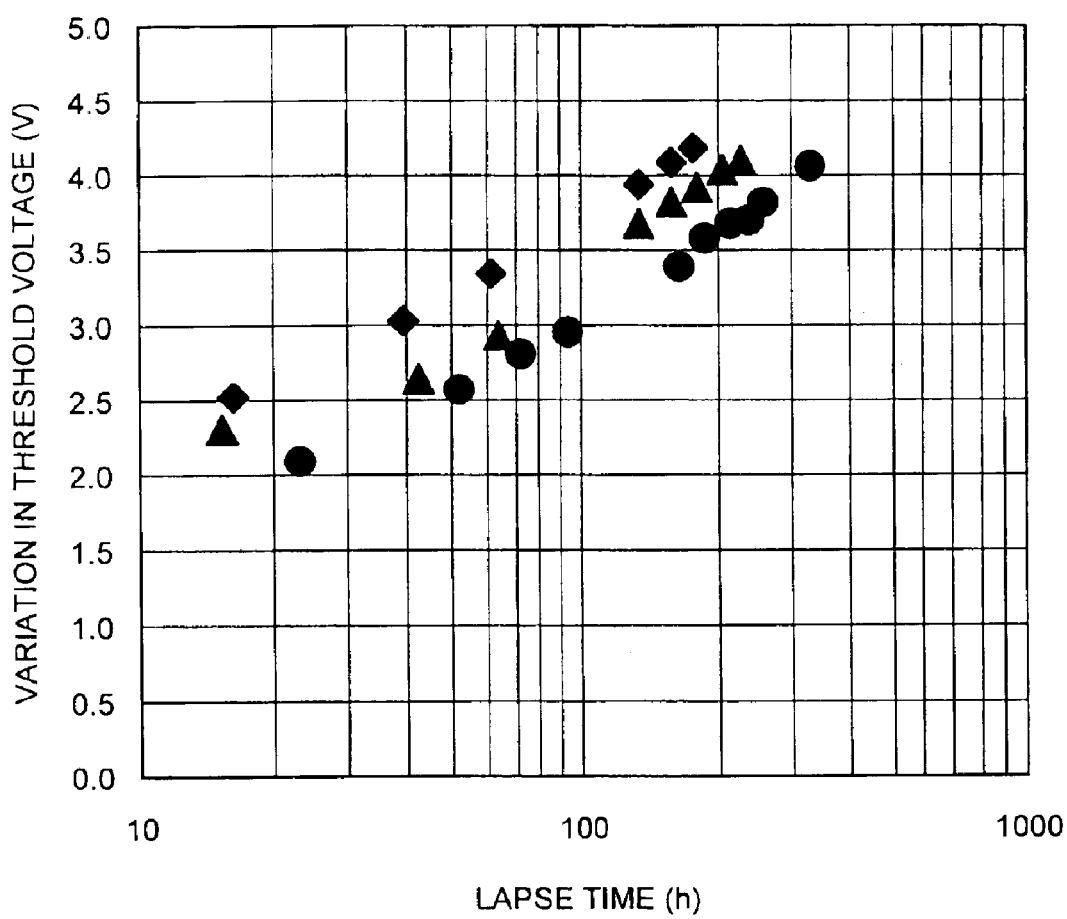
FIG. 4 is a graph of variation in the threshold voltage of the thin film transistor against time according to the first embodiment.
Figure 9A:
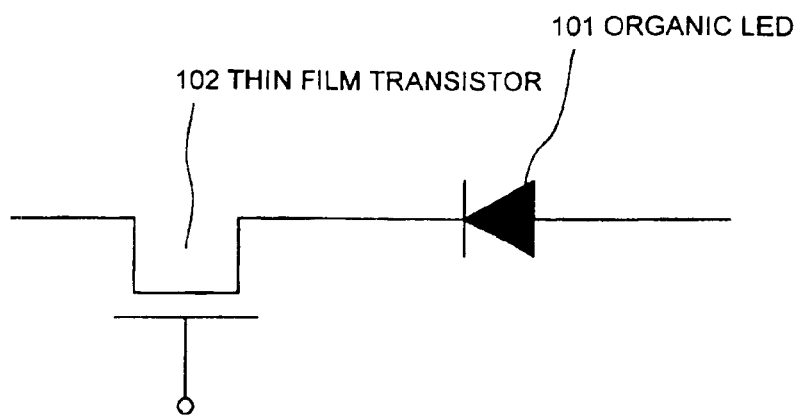
FIGS. 9A and 9B illustrate a conventional image display apparatus.
Figure 9B:
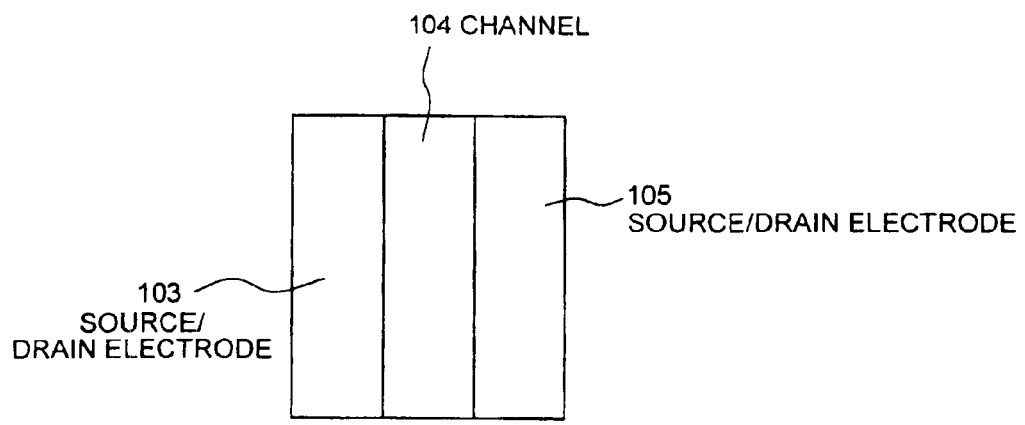

FIG. 4 is a graph of variation in the threshold voltage against time of the thin film transistor according to the first embodiment. In FIG. 4, solid circles correspond to a case when the thin film transistor according to the first embodiment, and solid triangles correspond to a case when the thin film transistor that has the conventional structure shown in FIG. 9B. The inventors also carried out a measurement using a thin film transistor that has the same structure as that of the first embodiment, wherein a higher potential is applied to the source/drain region that is disposed at the inside than a potential applied to the source/drain region that is disposed at the outside (see solid rhombs).

The measurement is carried out in a state that a difference between potentials of the source/drain regions is kept at 5 volts. Because of this potential difference, a variation in the threshold voltage is measured after a lapse of each predetermined time in a state that a predetermined voltage is applied to the gate electrode 5. As a result of the measurement, a variation in the threshold voltage of the thin film transistor according to the first embodiment is lower than a variation in the threshold voltage of the thin film transistor that has the conventional structure, after each predetermined time. When a period of time during which the threshold voltage varies by a certain value is a life of the thin film transistor, the life of the thin film transistor according to the first embodiment becomes longer than the life of the thin film transistor that has the conventional structure.

Further, as is clear from the graph shown in FIG. 4, when the thin film transistor is operated in the state that the potential of the source/drain region 3 is maintained higher than the potential of the source/drain region 1, the variation in the threshold voltage becomes smaller. A reason why it is possible to suppress the variation in the threshold voltage when the potential of the source/drain region 3 positioned externally is set higher is not clear at present. However, when the potential difference is inverted, the variation in the threshold voltage becomes larger than that of the thin film transistor that has the conventional structure. In the light of this fact, it is clear that, in order to suppress the variation in the threshold voltage, it is essential to operate the thin film transistor in the state that the potential of the source/drain region 3 disposed at the outside is maintained higher than the potential of the source/drain region 1 disposed at the inside.

As explained above, the thin film transistor according to the first embodiment suppresses the variation in the threshold voltage even when the thin film transistor is used in a continuously conductive state. Therefore, the thin film transistor can be used for a longer period than the conventional thin film transistor.

Figure 5:
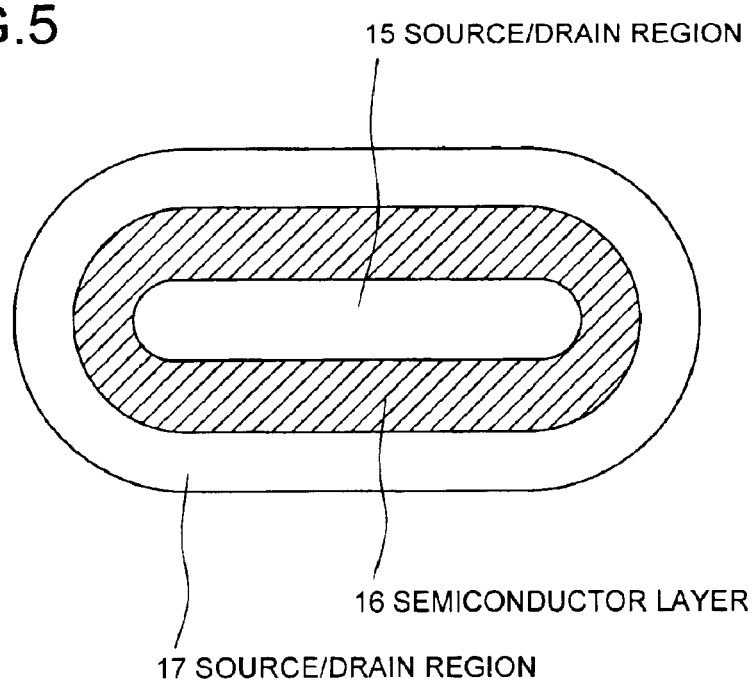
FIG. 5 is a top view of a modification of the thin film transistor according to the first embodiment.

As a modification of the thin film transistor according to the first embodiment, as shown in FIG. 5, the thin film transistor may have almost an elliptical shape when viewed from the top. This thin film transistor has a source/drain region 15, a source/drain region 17 that is disposed to cover the total external periphery of the source/drain region 15, and a semiconductor layer 16 that is disposed between the source/drain regions 15 and 17. Although not shown in FIG. 5, source/drain electrodes are disposed corresponding to the source/drain regions 15 and 17 respectively. There is also provided a gate electrode that induces a channel to the semiconductor layer 16 based on an application of a predetermined voltage during the operation.

Like in the thin film transistor according to the first embodiment, the potential of the source/drain region 17 that is disposed at the outside is maintained higher than the potential of the source/drain region 15 that is disposed at the inside. By adopting this structure, the thin film transistor according to the modification can suppress a variation in the threshold voltage during a use of the thin film transistor over a long period of time, like the thin film transistor according to the first embodiment. While a description of a detailed measurement result is omitted, the inventors of the present application also actually prepared the thin film transistor according to the modification. The inventors confirm that it is possible to suppress a variation in the threshold voltage to a level substantially equivalent to that of the thin film transistor according to the first embodiment.

While the thin film transistors according to the first embodiment and the modification thereof are explained above, the thin film transistor according to the present invention is not limited to these structures. For example, the external periphery of the source/drain region disposed at the inside and the internal periphery of the source/drain region disposed at the outside may also have other shape than the concentric circle or the elliptical shape, such as a rectangle, for example. Specifically, it is possible to employ an optional shape, so long as the source/drain region disposed at the outside covers the whole external periphery of the source/drain region disposed at the inside, and the source/drain region disposed at the outside has a higher potential during the operation. However, from the viewpoint of maintaining the density of the current that flows through the channel at substantially a constant level, it is preferable to provide a concentric circular shape that develops no singularity in the channel structure.

While the semiconductor layer disposed between the source/drain regions is formed with a non-monocrystalline silicon, it is also possible to use monocrystalline silicon. It is also possible to form a semiconductor layer by using other semiconductor materials such as GaAs, and AlGaAs. For a semiconductor material that forms the source/drain regions, it is also possible to use monocrystalline silicon or a material other than silicon.

The thin film transistors according to the first embodiment and the modification thereof have what is so-called a reverse stagger-type structure that has the gate electrode disposed in a lower layer than the source/drain regions. It is also possible to provide a so-called normal stagger-type structure that has the gate electrode disposed in a higher layer than the source/drain regions. In order to protect the semiconductor layer, a protection layer may be provided at a higher portion of the semiconductor layer.

An image display apparatus according to a second embodiment of the present invention has a light-emitting device that uses the thin film transistor according to the first embodiment as a driver, and current drives based on the driver.

Figure 6:
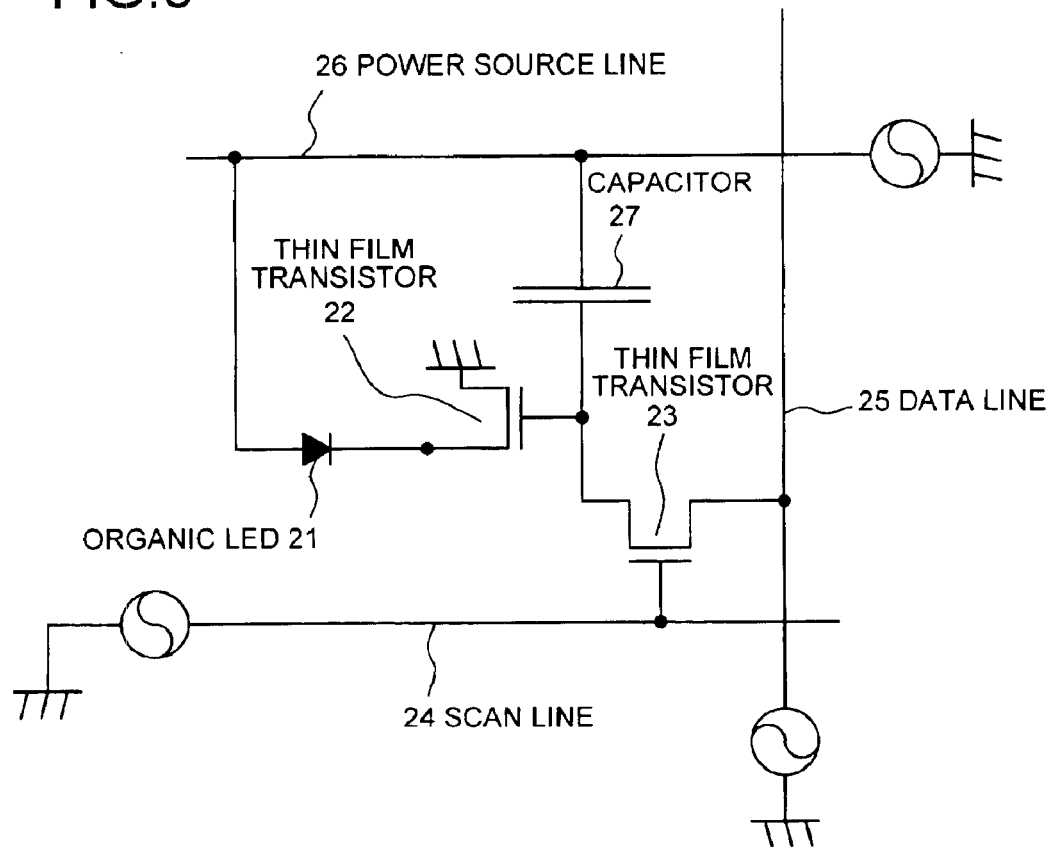
FIG. 6 is an equivalent circuit diagram of a part of a wiring circuit of an image display apparatus according to a second embodiment of the present invention.

FIG. 6 is an equivalent circuit diagram of a part of a wiring circuit of the image display apparatus according to the second embodiment. The image display apparatus has an organic LED 21, a thin film transistor 22 with one source/drain region connected to the organic LED 21, and a thin film transistor 23 that has its one source/drain region connected to the gate electrode of the thin film transistor 22, and that functions as a switching device. The thin film transistor 22 functions as a driver that controls a light emission state of the organic LED 21. The thin film transistor 23 functions as a switching device. The image display apparatus further has a scan line 24, a data line 25, and a power source line 26. The thin film transistor 23 has its gate electrode connected to the scan line 24, and has its other source/drain region connected to the data line 25. The organic LED 21 is connected to the power source line 26. A capacitor 27 is electrically connected between the power source line 26 and the other source/drain region of the thin film transistor 22. The scan line 24, the data line 25, and the power source line 26 are connected to respective predetermined driving circuits.

The organic LED 21 functions as a light-emitting device. The organic LED 21 has at least one of a hole transportation layer and an electron transportation layer, and a light emission layer. The organic LED 21 emits a predetermined light based on a light-emission recombination of hole injected to the light emission layer and electron.

The thin film transistor 22 functions as a driver and has the structure described in the first embodiment. The thin film transistor 22 suppresses a variation in the threshold voltage even when the on state of the thin film transistor 22 is maintained over a long time. Because of the potential applied to the gate electrode, the thin film transistor 22 prescribes a current that flows through a channel, thereby to control the current that flows to the series-connected organic LED 21, and control a flickering of a light emitted from the organic LED 21 and luminance during a light emission.

The thin film transistor 23 functions as a switching device. The on and off states of the thin film transistor 23 are controlled based on the potential of the scan line 24. During the on time, the thin film transistor 23 has a function of applying the potential supplied from the data line 25, to the gate electrode of the thin film transistor 22.

The image display apparatus has a plurality of data lines and a plurality of scan lines, and has the circuit elements shown in FIG. 6 connected to each data line and each scan line. A large number of organic LED are disposed corresponding to pixels. The image display apparatus has a function of displaying a predetermined image pattern as a whole by controlling the light emission state of each organic LED.

FIG. 7 is a cross-sectional view of a part of the structure of the image display apparatus according to the second embodiment. The thin film transistors 22 and 23 are laminated on a substrate 28. A conductive layer 29 that connects between the thin film transistors 22 and 23, and a conductive layer 30 that connects between the thin film transistor 22 and an organic LED 21 are laminated on the substrate 28. A planarizing layer 31, which is made of polymer or the like, is laminated on the substrate 28 and on the thin film transistors 22 and 23 and the conductive layers 29 and 30, except on a part of the region of the conductive layer 30. A conductive layer 26 that extends from the power source line is deposited on the planarizing layer 31. The organic LED 21 is disposed on a part of the region of the conductive layer 26. A conductive layer 33 is disposed on the organic LED 21, extends in a horizontal direction from the surface of the organic LED 21, and is connected to the conductive layer 30 via a conductive layer 32.

Thus, the planarizing layer 31 is present between the thin film transistors 22 and 23 and the organic LED 21. Unlike the liquid-crystal display apparatus, since the image display apparatus according to the second embodiment has a structure to displaying an image based on a self-luminescence, the circuit elements disposed below the organic LED 21 do not affect the display image. Consequently, the image display apparatus according to the second embodiment can have the circuit elements disposed three-dimensionally, and can sufficiently secure an effective image region.

The operation of the image display apparatus according to the second embodiment will be explained next while referring to FIG. 6. A not shown driving circuit, which is connected to the scan line 24, applies a potential to the scan line 24. The magnitude of the potential is such that it turns on the thin film transistor 23. At substantially the same time, a not shown driving circuit connected to the data line 25 applies a predetermined potential to the data line 25.

The scan line 24 applies a predetermined potential to the gate electrode. Therefore, the thin film transistor 23 is turned on, thereby to induce a channel between the source/drain electrodes and make the source/drain electrodes conductive. Based on the potential of the data line 25, a current flows through the channel. A potential is applied to the thin film transistor 22, and at the same time, a predetermined charge is accumulated in the capacitor 27. After the application of the potential to the gate electrode of the thin film transistor 22, the potential of the scan line 24 is lowered, and the thin film transistor 23 is set to the off state. However, the potential of the thin film transistors 22 is maintained based on the charge accumulated in the capacitor 27.

When the predetermined potential is applied to the gate electrode, the thin film transistor 22 is set to the on state, and the source/drain electrodes of the thin film transistor 22 become conductive to each other. As the thin film transistor 22 is connected to the organic LED 21, the source/drain electrodes become conductive to each other, and a current flows from the power source line 26 to the organic LED 21 thereby to make the organic LED 21 emit a light. The luminance of the light emitted from the organic LED 21 is controlled based on the potential of the gate electrode of the thin film transistor 22.

As explained above, as the image display apparatus according to the second embodiment displays an image by using the self-luminescent organic LED, the image display apparatus does not require a light source such as a back light. Therefore, it is possible to reduce power consumption required for the back light. It is also possible to avoid an increase in the size and complexity of the apparatus due to the provision of the back light unit. Further, the organic LED is superior to the liquid-crystal display device in visibility, response speed, and contrast, and can display a high-definition image.

In the second embodiment, the thin film transistor described in the first embodiment is used for the thin film transistor 22. Advantages of the use of the thin film transistor according to the first embodiment for the driver will be explained next.

As is clear from the circuit diagram shown in FIG. 6, the thin film transistor 22 is connected to the organic LED 21, and the current that flows through the organic LED 21 flows through the channel of the thin film transistor 22. During the image display time, it is necessary to continuously flow a current to the organic LED 21. Therefore, the current also flows continuously to the channel of the thin film transistor 22. Consequently, when a thin film transistor that has the conventional structure is used for the thin film transistor 22, the threshold voltage varies due to the aged degradation, and it becomes difficult to adjust the luminance of the organic LED 21. However, as explained above, the thin film transistor according to the first embodiment has one source/drain region disposed to cover the external periphery of the other source/drain region. The source/drain region that covers the external periphery of the other source/drain region has a high potential during the operation. Therefore, the thin film transistor can suppress the variation in the threshold voltage even when the thin film transistor is used in a continuously conductive state over a long time.

Therefore, unlike the conventional image display apparatus, the image display apparatus according to the second embodiment can suppress a sticking of the screen and a variation in the luminance even when the image display apparatus carries out an image display over a long time. As a result, it is possible to carry out a high-definition image display over a long time, and it is possible to suppress degradation of image definition.

While the organic LED displays an image in the image display apparatus according to the second embodiment, it is also possible to use an inorganic LED other than the organic LED, and it is also possible to use a light-emitting diode. These light-emitting devices emit a light based on a current driving. When the thin film transistor according to the first embodiment is used as a driver, it is possible to carry out a high-definition image display over a long term.

Figure 8A:
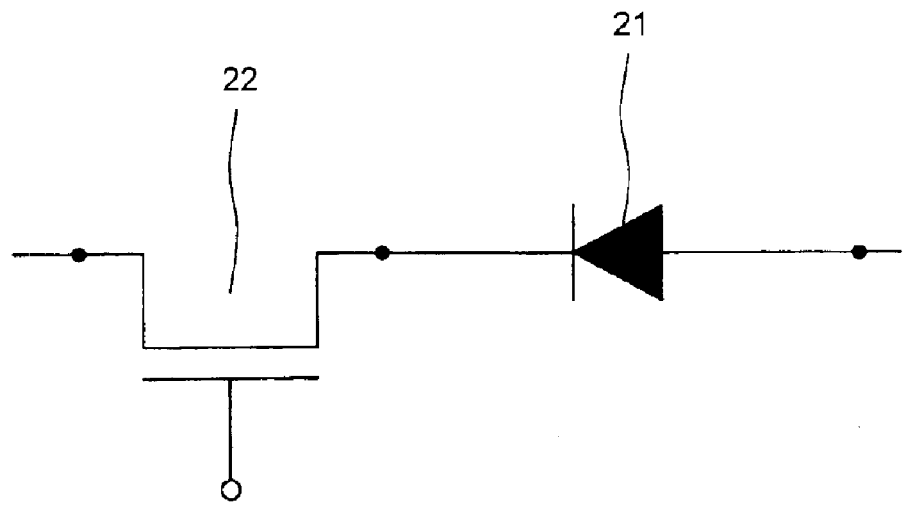
FIG. 8A and FIG. 8B are equivalent circuit diagrams illustrating states of a connection between an organic LED and a thin film transistor in the image display apparatus according to the second embodiment.
Figure 8B:
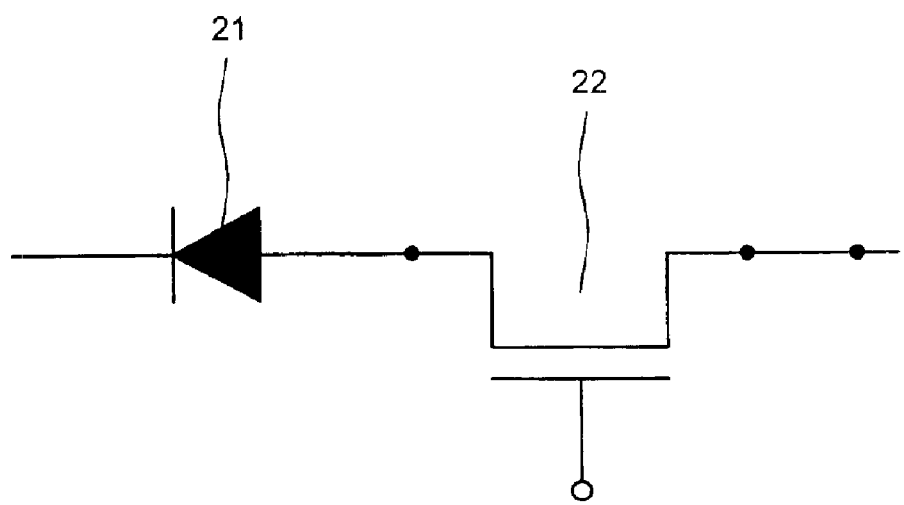

While the image display apparatus according to the second embodiment has the anode of the organic LED 21 connected to the thin film transistor 22 as shown in FIG. 6 and FIG. 8A, it is also possible to have the cathode of the organic LED 21 connected to the thin film transistor 22 as shown in FIG. 8B. In the case of the structure shown in FIG. 6 and FIG. 8A, the source/drain electrode that is connected to the organic LED 21 needs to be connected to the source/drain region 3 shown in FIG. 1. In the case of the structure shown in FIG. 8B, the source/drain electrode that is connected to the organic LED 21 needs to be connected to the source/drain region 1 shown in FIG. 1.

In the image display apparatus according to the second embodiment, while a detailed structure of the thin film transistor 23 is not particularly referred to, it is also possible to use the thin film transistor according to the first embodiment for the thin film transistor 23. The thin film transistor according to the first embodiment has an advantage that it is possible to suppress the variation in the threshold voltage during a long-term use of the thin film transistor, in addition to the characteristics that the thin film transistor of the conventional structure has. Therefore, there is no problem in the continuous conduction of a current and in the utilization of the thin film transistor for the voltage driving device or the like. While the image display apparatus according to the second embodiment utilizes the thin film transistor according to the first embodiment, the application of the thin film transistor according to the first embodiment is not limited to the image display apparatus.

As explained above, according to one aspect of the present invention, a second source/drain region is disposed to cover the external periphery of a first source/drain region. At least during the operation, the potential of the second source/drain region is maintained higher than the potential of the first source/drain region. Therefore, even when the thin film transistor is used by maintaining the on state and by continuously flowing a current, it is possible to suppress the variation of the threshold voltage unlike the conventional thin film transistor.

According to another aspect of the present invention, the image display apparatus has a light-emitting device of the current-driving system by using the thin film transistor as a driver. Therefore, despite a continuous flow of a current to the light-emitting device and the driver, it is possible to suppress the degradation of image definition and it is possible to realize the image display apparatus that has a long life.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A thin film transistor comprising:
   a first source/drain electrode;
   a first source/drain region that is connected to the first source/drain electrode, wherein the first source/drain region has a first potential, wherein the first source/drain region has an external periphery;
   a second source/drain electrode;
   a second source/drain region that is connected to the second source/drain electrode, wherein the second source/drain region has an internal periphery that surrounds the external periphery of the first source/drain region, wherein at least during the operation the second source/drain region has a second potential that is higher than the first potential;
   a semiconductor layer that is disposed between the first source/drain region and the second source/drain region; and
   a gate electrode that induces a channel in the semiconductor layer wherein the semiconductor layer is disposed between the gate electrode and the first and second source/drain electrodes.

2. The thin film transistor according to claim 1, wherein the external periphery of the first source/drain region and the internal periphery of the second source/drain region are concentric circles.

3. The thin film transistor according to claim 1, wherein the external periphery of the first source/drain region and the internal periphery of the second source/drain region are substantially elliptical.

4. The thin film transistor according to claim 1, wherein the semiconductor layer is made of non-monocrystalline silicon.

5. An image display device comprising:

a light-emitting device;

a first thin film transistor that controls a light emission state of the light-emitting device, wherein the first thin film transistor includes a first source/drain electrode;

a first source/drain region that is connected to the first source/drain electrode, wherein the first source/drain region has a first potential, wherein the first source/drain region has an external periphery;

a second source/drain electrode;

a second source/drain region that is connected to the second source/drain electrode, wherein the second source/drain region has an internal periphery that surrounds the external periphery of the first source/drain region, wherein at least during the operation the second source/drain region has a second potential that is higher than the first potential;

a semiconductor layer that is disposed between the first source/drain region and the second source/drain region; and a gate electrode that induces a channel in the semiconductor layer;

a second thin film transistor that controls a gate potential of the first thin film transistor; and a capacitor that holds the gate potential of the first thin film transistor controlled by the first thin film transistor.

6. The image display device according to claim 5, wherein the light-emitting device is an organic light emitting diode, and any one of the first source/drain electrode and the second source/drain electrode of the first thin film transistor is connected to the organic light emitting diode, and the first thin film transistor controls flow of a current to the organic light emitting diode.

7. The image display device according to claim 5, further comprising:

a scan line that supplies a scan signal, and a data line that supplies a display signal, wherein the gate electrode of the second thin film transistor is connected to the scan line, and the second thin film transistor has a source/drain electrode that is connected to the data line.

8. An image display apparatus comprising:

a plurality of scan lines and a plurality of data lines that are disposed in a matrix form and are connected to driving circuits respectively;

light-emitting devices that are disposed corresponding to display pixels;

power source lines that supply a current to the light-emitting devices;

a first thin film transistor that is disposed between each light-emitting device and each power source line and that controls a light emission state of the light-emitting device, wherein the first thin film transistor includes a first source/drain electrode;

a first source/drain region that is connected to the first source/drain electrode, wherein the first source/drain region has a first potential, wherein the first source/drain region has an external periphery;

a second source/drain electrode;

a second source/drain region that is connected to the second source/dram electrode, wherein the second source/drain region has an internal periphery that surrounds the external periphery of the first source/drain region, wherein at least during the operation the second source/drain region has a second potential that is higher than the first potential;

a semiconductor layer that is disposed between the first source/drain region and the second source/drain region; and a gate electrode that induces a channel in the semiconductor layer; and a second thin film transistor that is disposed between the gate electrode of the first thin film transistor and a predetermined data line, and that controls a gate potential of the first thin film transistor.

9. The image display apparatus according to claim 8, wherein the light-emitting device is an organic light emitting diode, and any one of the first source/drain electrode and the second source/drain electrode of the first thin film transistor is connected to the light-emitting device.

10. The thin film transistor of claim 1, wherein the semiconductor layer is disposed between the gate electrode and the first and second source/drain electrodes in a cross-sectional view of the thin film transistor, the cross-sectional view being perpendicular to a plan view of the thin film transistor.

11. The thin film transistor of claim 1, wherein the internal periphery of the second source/drain region surrounds the external periphery of the first source/drain region in a plan view of the thin film transistor.

12. The thin film transistor of claim 1, wherein the semiconductor layer is disposed between the first source/drain region and the second source/drain region in a plan view of the thin film transistor.

* * * * *